(12) United States Patent
Gharibdoust

(10) Patent No.: US 11,290,115 B2
(45) Date of Patent: Mar. 29, 2022

(54) LOW LATENCY COMBINED CLOCK DATA RECOVERY LOGIC NETWORK AND CHARGE PUMP CIRCUIT

(71) Applicant: Kandou Labs, S.A., Lausanne (CH)

(72) Inventor: Kiarash Gharibdoust, Lonay (CH)

(73) Assignee: KANDOU LABS, S.A., Lausanne (CH)

( * ) Notice: Subject to any disclaimer, the term of this patent is extended or adjusted under 35 U.S.C. 154(b) by 459 days.

(21) Appl. No.: 16/439,483

(22) Filed: Jun. 12, 2019

(65) Prior Publication Data
US 2019/0377378 A1    Dec. 12, 2019

Related U.S. Application Data

(60) Provisional application No. 62/684,051, filed on Jun. 12, 2018.

(51) Int. Cl.
*H03L 7/08* (2006.01)
*G06F 1/10* (2006.01)
(Continued)

(52) U.S. Cl.
CPC .............. *H03L 7/0807* (2013.01); *G06F 1/10* (2013.01); *H03K 19/20* (2013.01); *H03L 7/085* (2013.01);
(Continued)

(58) Field of Classification Search
CPC ........ H03L 7/0807; H03L 7/085–0891; H03M 1/1255; H04L 25/03057; H03K 19/20;
(Continued)

(56) References Cited

U.S. PATENT DOCUMENTS 4,839,907 A    6/1989 Saneski
5,266,907 A    11/1993 Dacus
(Continued)

FOREIGN PATENT DOCUMENTS

CN    203675093 U    6/2014
EP    0740423 A2    10/1996

OTHER PUBLICATIONS

Chang, Hong-Yeh, et al., "A Low-Jitter Low-Phase-Noise 10-GHz Sub-Harmonically Injection-Locked PLL With Self-Aligned DLL in 65-nm CMOS Technology", IEEE Transactions on Microwave Theory and Techniques, vol. 62, No. 3, Mar. 2014, 543-555 (13 pages).

(Continued)

*Primary Examiner* — Patrick C Chen
(74) *Attorney, Agent, or Firm* — Invention Mine LLC

(57) ABSTRACT

Methods and systems are described for obtaining a sequence of data decisions and an error signal generated by one or more samplers operating on a received input signal according to a sampling clock, applying the sequence of data decisions and the error signal to each logic branch of a set of logic branches, and responsively selecting a logic branch from the set of logic branches, the logic branch selected responsive to (i) a detection of a transitional data pattern in the sequence of data decisions and (ii) the error signal, the selected logic branch generating an output current, and providing the output current to a local oscillator controller, the output current sourcing and sinking current to a capacitor through a resistive element to adjust an input voltage of a proportional control circuit relative to a voltage on the capacitor connected to the resistive element.

20 Claims, 10 Drawing Sheets

(51) Int. Cl.
  *H03L 7/085* (2006.01)
  *H03L 7/089* (2006.01)
  *H03M 1/12* (2006.01)
  *H03K 19/20* (2006.01)
(52) U.S. Cl.
  CPC ........ *H03L 7/0891* (2013.01); *H03M 1/1255* (2013.01)
(58) Field of Classification Search
  CPC .... H03K 19/21; H03K 19/212; H03K 19/215; G06F 1/10
  See application file for complete search history.

(56) References Cited

U.S. PATENT DOCUMENTS

| | | | |
|---|---|---|---|
| 5,528,198 | A | 6/1996 | Baba et al. |
| 5,602,884 | A | 2/1997 | Wieczorkiewicz et al. |
| 5,629,651 | A | 5/1997 | Mizuno |
| 5,802,356 | A | 9/1998 | Gaskins et al. |
| 6,026,134 | A | 2/2000 | Duffy et al. |
| 6,037,812 | A | 3/2000 | Gaudet |
| 6,122,336 | A | 9/2000 | Anderson |
| 6,307,906 | B1 | 10/2001 | Tanji et al. |
| 6,316,987 | B1 | 11/2001 | Dally et al. |
| 6,380,783 | B1 | 4/2002 | Chao et al. |
| 6,389,091 | B1 | 5/2002 | Yamaguchi et al. |
| 6,426,660 | B1 | 7/2002 | Ho et al. |
| 6,507,544 | B1 | 1/2003 | Ma et al. |
| 6,509,773 | B2 | 1/2003 | Buchwald et al. |
| 6,633,621 | B1 | 10/2003 | Bishop et al. |
| 6,717,478 | B1 | 4/2004 | Kim et al. |
| 6,838,951 | B1 | 1/2005 | Nieri et al. |
| 6,917,762 | B2 | 7/2005 | Kim |
| 7,078,978 | B2 | 7/2006 | Wakii |
| 7,102,449 | B1 | 9/2006 | Mohan |
| 7,199,728 | B2 | 4/2007 | Dally et al. |
| 7,336,112 | B1 | 2/2008 | Sha et al. |
| 7,532,697 | B1 | 5/2009 | Sidiropoulos et al. |
| 7,535,957 | B2 | 5/2009 | Ozawa et al. |
| 7,616,075 | B2 | 11/2009 | Kushiyama |
| 7,650,525 | B1 | 1/2010 | Chang et al. |
| 7,688,929 | B2 | 3/2010 | Co |
| 7,822,113 | B2 * | 10/2010 | Tonietto .................. H03L 7/091 375/233 |
| 7,839,229 | B2 | 11/2010 | Nakamura et al. |
| 7,852,109 | B1 | 12/2010 | Chan et al. |
| 7,860,190 | B2 | 12/2010 | Feller |
| 8,036,300 | B2 | 10/2011 | Evans et al. |
| 8,253,454 | B2 | 8/2012 | Lin |
| 8,791,735 | B1 | 7/2014 | Shibasaki |
| 8,929,496 | B2 | 1/2015 | Lee et al. |
| 9,036,764 | B1 | 5/2015 | Hossain et al. |
| 9,059,816 | B1 | 6/2015 | Simpson et al. |
| 9,306,621 | B2 | 4/2016 | Zhang et al. |
| 9,374,250 | B1 | 6/2016 | Musah et al. |
| 9,397,868 | B1 | 7/2016 | Hossain et al. |
| 9,438,409 | B1 | 9/2016 | Liao et al. |
| 9,520,883 | B2 | 12/2016 | Shibasaki |
| 9,565,036 | B2 | 2/2017 | Zerbe et al. |
| 9,577,815 | B1 | 2/2017 | Simpson et al. |
| 9,602,111 | B1 | 3/2017 | Shen et al. |
| 9,906,358 | B1 | 2/2018 | Tajalli |
| 9,960,902 | B1 | 5/2018 | Lin et al. |
| 10,055,372 | B2 | 8/2018 | Shokrollahi |
| 10,193,716 | B2 | 1/2019 | Hormati et al. |
| 10,326,435 | B2 | 6/2019 | Arp et al. |
| 2003/0001557 | A1 | 1/2003 | Pisipaty |
| 2003/0146783 | A1 | 8/2003 | Bandy et al. |
| 2003/0212930 | A1 | 11/2003 | Aung et al. |
| 2004/0092240 | A1 | 5/2004 | Hayashi |
| 2004/0141567 | A1 | 7/2004 | Yang et al. |
| 2005/0024117 | A1 | 2/2005 | Kubo et al. |
| 2005/0084050 | A1 | 4/2005 | Cheung et al. |
| 2005/0117404 | A1 | 6/2005 | Savoj |
| 2005/0128018 | A1 | 6/2005 | Meltzer |
| 2005/0141662 | A1 | 6/2005 | Sano et al. |
| 2005/0201491 | A1 | 9/2005 | Wei |
| 2005/0220182 | A1 | 10/2005 | Kuwata |
| 2005/0275470 | A1 | 12/2005 | Choi |
| 2006/0062058 | A1 | 3/2006 | Lin |
| 2006/0140324 | A1 | 6/2006 | Casper et al. |
| 2006/0232461 | A1 | 10/2006 | Felder |
| 2007/0001713 | A1 | 1/2007 | Lin |
| 2007/0001723 | A1 | 1/2007 | Lin |
| 2007/0047689 | A1 | 3/2007 | Menolfi et al. |
| 2007/0086267 | A1 | 4/2007 | Kwak |
| 2007/0146088 | A1 | 6/2007 | Arai et al. |
| 2007/0147559 | A1 | 6/2007 | Lapointe |
| 2007/0183552 | A1 | 8/2007 | Sanders et al. |
| 2007/0201597 | A1 | 8/2007 | He et al. |
| 2008/0007367 | A1 | 1/2008 | Kim |
| 2008/0111634 | A1 | 5/2008 | Min |
| 2008/0136479 | A1 | 6/2008 | You et al. |
| 2008/0165841 | A1 | 7/2008 | Wall et al. |
| 2008/0181289 | A1 | 7/2008 | Moll |
| 2008/0219399 | A1 | 9/2008 | Nary |
| 2008/0317188 | A1 | 12/2008 | Staszewski et al. |
| 2009/0103675 | A1 | 4/2009 | Yousefi et al. |
| 2009/0167389 | A1 | 7/2009 | Reis |
| 2009/0195281 | A1 | 8/2009 | Tamura et al. |
| 2009/0231006 | A1 | 9/2009 | Jang et al. |
| 2009/0243679 | A1 | 10/2009 | Smith et al. |
| 2009/0262876 | A1 | 10/2009 | Arima et al. |
| 2009/0262877 | A1 | 10/2009 | Shi et al. |
| 2010/0033259 | A1 | 2/2010 | Miyashita |
| 2010/0090723 | A1 | 4/2010 | Nedovic et al. |
| 2010/0090735 | A1 | 4/2010 | Cho |
| 2010/0156543 | A1 | 6/2010 | Dubey |
| 2010/0180143 | A1 | 7/2010 | Ware et al. |
| 2010/0220828 | A1 | 9/2010 | Fuller et al. |
| 2011/0002181 | A1 | 1/2011 | Wang et al. |
| 2011/0025392 | A1 | 2/2011 | Wu et al. |
| 2011/0148498 | A1 | 6/2011 | Mosalikanti et al. |
| 2011/0234278 | A1 | 9/2011 | Seo |
| 2011/0311008 | A1 | 12/2011 | Slezak et al. |
| 2012/0051480 | A1 | 3/2012 | Usugi et al. |
| 2012/0200364 | A1 | 8/2012 | Iizuka et al. |
| 2012/0206177 | A1 | 8/2012 | Colinet et al. |
| 2012/0235717 | A1 | 9/2012 | Hirai et al. |
| 2012/0327993 | A1 | 12/2012 | Palmer |
| 2013/0088274 | A1 | 4/2013 | Gu |
| 2013/0091392 | A1 | 4/2013 | Valliappan et al. |
| 2013/0093471 | A1 | 4/2013 | Cho et al. |
| 2013/0107997 | A1 | 5/2013 | Chen |
| 2013/0108001 | A1 | 5/2013 | Chang et al. |
| 2013/0207706 | A1 | 8/2013 | Yanagisawa |
| 2013/0243127 | A1 | 9/2013 | Ito et al. |
| 2013/0271194 | A1 | 10/2013 | Madoglio et al. |
| 2013/0285720 | A1 | 10/2013 | Jibry |
| 2013/0314142 | A1 | 11/2013 | Tamura et al. |
| 2014/0286381 | A1 | 9/2014 | Shibasaki |
| 2014/0286457 | A1 | 9/2014 | Chaivipas |
| 2015/0043627 | A1 | 2/2015 | Kang et al. |
| 2015/0078495 | A1 | 3/2015 | Hossain et al. |
| 2015/0117579 | A1 | 4/2015 | Shibasaki |
| 2015/0180642 | A1 | 6/2015 | Hsieh et al. |
| 2015/0220472 | A1 | 8/2015 | Sengoku |
| 2015/0256326 | A1 | 9/2015 | Simpson et al. |
| 2016/0056980 | A1 | 2/2016 | Wang et al. |
| 2016/0087610 | A1 * | 3/2016 | Hata .................. H03L 7/0802 327/199 |
| 2016/0134267 | A1 | 5/2016 | Adachi |
| 2017/0019276 | A1 | 1/2017 | Francese |
| 2017/0147520 | A1 * | 5/2017 | Shokrollahi ............ H04L 25/49 |
| 2017/0228215 | A1 * | 8/2017 | Chatwin .................. G06F 7/509 |
| 2017/0310456 | A1 | 10/2017 | Tajalli |
| 2017/0317859 | A1 * | 11/2017 | Hormati ............ H04L 25/03885 |
| 2018/0083763 | A1 | 3/2018 | Black et al. |
| 2018/0219539 | A1 | 8/2018 | Arp et al. |
| 2018/0227114 | A1 | 8/2018 | Rahman et al. |
| 2018/0343011 | A1 | 11/2018 | Tajalli et al. |
| 2018/0375693 | A1 | 12/2018 | Zhou et al. |

(56) References Cited

U.S. PATENT DOCUMENTS

| | | |
|---|---|---|
| 2019/0109735 A1 | 4/2019 | Norimatsu |
| 2019/0238308 A1 | 8/2019 | Tajalli |
| 2021/0248103 A1 | 8/2021 | Khashaba et al. |

OTHER PUBLICATIONS

Nandwana, Romesh Kumar, et al., "A Calibration-Free Fractional-N Ring PLL Using Hybrid Phase/Current-Mode Phase Interpolation Method", IEEE Journal of Solid-State Circuits, vol. 50, No. 4, Apr. 2015, 882-895 (14 pages).

NG, Herman Jalli, et al., "Low Phase Noise 77-GHz Fractional-N PLL with DLL-based Reference Frequency Multiplier for FMCW Radars", European Microwave Integrated Circuits Conference, Oct. 10-11, 2011, 196-199 (4 pages).

Tajalli, Armin, "Wideband PLL Using Matrix Phase Comparator", Journal of Latex Class Files, vol. 14, No. 8, Aug. 2016, 1-8 (8 pages).

Loh, Mattew, et al., "A 3×9 GB/s Shared, All-Digital CDR for High-Speed, High-Density I/O", IEEE Journal of Solid-State Circuits, vol. 47, No. 3, Mar. 2012, 641-651 (11 pages).

Tan, Han-Yuan, "Design of Noise-Robust Clock and Data Recovery Using an Adaptive-Bandwidth Mixed PLL/DLL", Harvard University Thesis, Nov. 2006, 1-169 (169 pages).

International Search Report and Written Opinion for PCT/US2019/036826, dated Sep. 23, 2019, 1-16 (16 pages).

Riley, M. W., et al., "Cell Broadband Engine Processor: Design and Implementation", IBM Journal of Research and Development, vol. 51, No. 5, Sep. 2007, 545-557 (13 pages).

Ha, J.C., et al., "Unified All-Digital Duty-Cycle and phase correction circuit for QDR I/O interface", Electronic Letters, The Institution of Engineering and Technology, vol. 44, No. 22, Oct. 23, 2008, 1300-1301 (2 pages).

Ryu, Kyungho, et al., "Process-Variation-Calibrated Multiphase Delay Locked Loop With a Loop-Enbedded Duty Cycle Corrector", IEEE Transactions on Circuits and Systems, vol. 61, No. 1, Jan. 2014, 1-5 (5 pages).

Wang, Yi-Ming, et al., "Range Unlimited Delay-Interleaving and -Recycling Clock Skew Compensation and Duty-Cycle Correction Circuit", IEEE Transactions on Very Large Scale Integration (VLSI) Systems, vol. 23, No. 5, May 2015, 856-868 (13 pages).

\* cited by examiner

[0 1] Transitional Data Pattern

[1 0] Transitional Data Pattern

LOW LATENCY COMBINED CLOCK DATA RECOVERY LOGIC NETWORK AND CHARGE PUMP CIRCUIT

CROSS-REFERENCE TO RELATED APPLICATIONS

This application claims the benefit of U.S. Provisional Application No. 62/684,051, filed Jun. 12, 2018, entitled "Low Latency Combined Clock Data Recovery Logic Network and Charge Pump Circuit", which is hereby incorporated herein by reference in its entirety for all purposes.

REFERENCES

The following prior applications are herein incorporated by reference in their entirety for all purposes:

U.S. patent application Ser. No. 15/582,545, filed Apr. 28, 2017, naming Ali Hormati and Richard Simpson, entitled "Clock Data Recovery with Decision Feedback Equalization", hereinafter identified as [Hormati].

U.S. patent application Ser. No. 15/881,509, filed Jan. 26, 2018, naming Armin Tajalli, entitled "Dynamically Weighted Exclusive OR Gate Having Weighted Output Segments for Phase Detection and Phase Interpolation", hereinafter identified as [Tajalli].

BACKGROUND

It is common for communications receivers to extract a receive clock signal from the received data stream. Some communications protocols facilitate such Clock Data Recovery (CDR) operation by constraining the communications signaling so as to distinguish between clock-related and data-related signal components. Similarly, some communications receivers process the received signals beyond the minimum necessary to detect data, so as to provide the additional information to facilitate clock recovery. As one example, a so-called double-baud-rate receive sampler may measure received signal levels at twice the expected data reception rate, to allow independent detection of the received signal level corresponding to the data component, and the chronologically offset received signal transition related to the signal clock component.

However, the introduction of extraneous communications protocol transitions limits achievable data communication rate. Similarly, receive sampling at higher than transmitted data rate substantially increases receiver power utilization.

Data-dependent receive equalization is also well known in the art. Generally, these time-domain-oriented equalization methods focus on compensating for the effects of inter-symbol-interference or ISI on the received signal. Such ISI is caused by the residual electrical effects of a previously transmitted signal persisting in the communications transmission medium, so as to affect the amplitude or timing of the current symbol interval. As one example, a transmission line medium having one or more impedance anomalies may introduce signal reflections. Thus, a transmitted signal will propagate over the medium and be partially reflected by one or more such anomalies, with such reflections appearing at the receiver at a later time in superposition with signals propagating directly.

One method of data-dependent receive equalization is Decision Feedback Equalization or DFE. In DFE, the time-domain oriented equalization is performed by maintaining a history of previously-received data values at the receiver, which are processed by a transmission line model to predict the expected influence that each of the historical data values would have on the present receive signal. Such a transmission line model may be pre-calculated, derived by measurement, or generated heuristically, and may encompass the effects of one or more than one previous data interval. The predicted influence of these one or more previous data intervals is collectively called the DFE compensation. At low to moderate data rates, the DFE compensation may be calculated in time to be applied before the next data sample is detected, as example by being explicitly subtracted from the received data signal prior to receive sampling, or implicitly subtracted by modifying the reference level to which the received data signal is compared in the receive data sampler or comparator. However, at higher data rates the detection of previous data bits and computation of the DFE compensation may not be complete in time for the next data sample, requiring use of so-called "unrolled" DFE computations performed on speculative or potential data values rather than known previous data values. As one example, an unrolled DFE stage may predict two different compensation values depending on whether the determining data bit will resolve to a one or a zero, with the receive detector performing sampling or slicing operations based on each of those predictions, the multiple results being maintained until the DFE decision of the prior unit interval is resolved.

BRIEF DESCRIPTION

Methods and systems are described for obtaining a sequence of data decisions from a history buffer and an error signal, the sequence of data decisions and the error signal generated by one or more samplers operating on a received input signal according to a sampling clock, applying the sequence of data decisions and the error signal to each logic branch of a set of logic branches, and responsively selecting a logic branch from the set of logic branches, the logic branch selected responsive to (i) a detection of a transitional data pattern in the sequence of data decisions and (ii) the error signal, the selected logic branch generating an output current, and providing the output current to a local oscillator controller to adjust an input voltage of a proportional control circuit, the output current sourcing and sinking current to a capacitor through a resistive element to adjust the input voltage of the proportional control circuit relative to a voltage on the capacitor connected to the resistive element.

DETAILED DESCRIPTION

Figure 1:
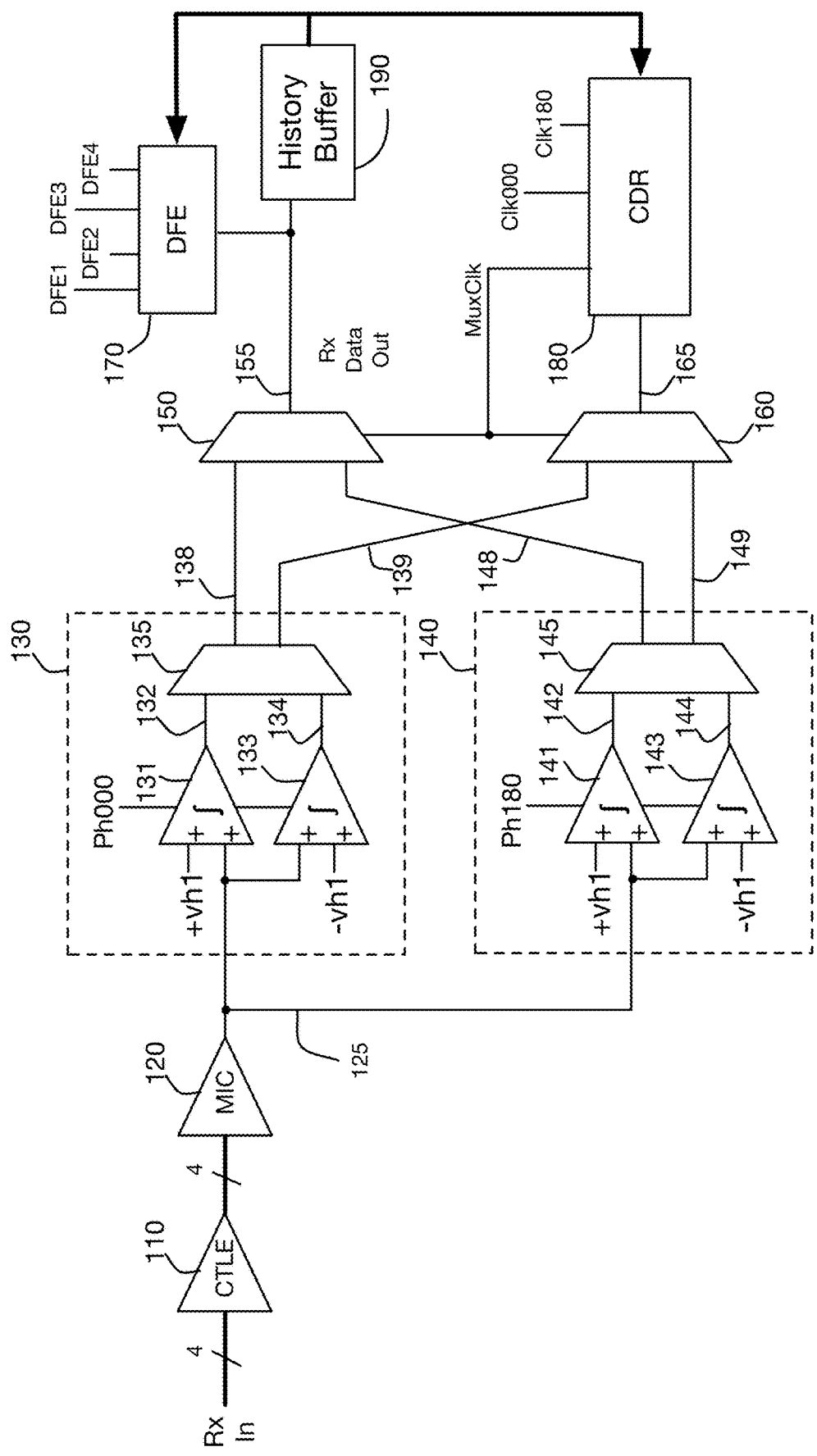
FIG. 1 is a multi-phase speculative DFE sampling device for exchanging data decisions between various phases, in accordance with some embodiments.

In recent years, the signaling rate of high speed communications systems have reached speeds of tens of gigabits per second, with individual data unit intervals measured in picoseconds. Conventional practice for a high-speed integrated circuit receiver has each data line terminate (after any relevant front end processing such as amplification and frequency equalization) in a sampling device. This sampling device performs a measurement constrained in both time and amplitude dimensions; in one example embodiment, it may be composed of a sample-and-hold circuit that constrains the time interval being measured, followed by a threshold detector or digital comparator that determines whether the signal within that interval falls above or below (or in some embodiments, within bounds set by) a reference value. Alternatively, a digital comparator may determine the signal amplitude followed by a clocked digital flip-flop capturing the result at a selected time. In other embodiments, a combined time- and amplitude-sampling circuit is used, sampling the amplitude state of its input in response to a clock transition.

Subsequently, this document will use the term sampling device, or more simply "sampler" to describe this receiver component that generates the input measurement, as it implies both the time and amplitude measurement constraints, rather than the equivalent but less descriptive term "slicer" also used in the art. The well-known receiver "eye plot" graphically illustrates input signal values that will or will not provide accurate and reliable detected results from such measurement, and thus the allowable boundaries of the time- and amplitude-measurement windows imposed on the sampler.

Clock Data Recovery

So-called Clock Data Recovery or CDR circuits as in [Hormati] support such sampling measurements by extracting timing information, as one example from signal transitions on the data lines themselves and utilizing that extracted information to generate clock signals to control the time interval used by the data line sampling device(s). The actual clock extraction may be performed using well known circuits such as a Phase Locked Loop (PLL) or Delay Locked Loop (DLL), which in their operation may also generate higher frequency internal clocks, multiple clock phases, etc. in support of receiver operation.

In some embodiments, CDR involves two interrelated operations; generation of a local clock signal having a known phase relationship with the received signal, and derivation of a properly timed sampling clock from that local clock. Such indirect synchronization may occur if the receiver operates at a different rate than the received data, as one example utilizing two alternating receive processing phases, each operating at one half the receive data rate. Furthermore, the naturally locked phase relationship between the signal used as an external phase reference and the local clock may be quite different from the desired sample clock timing, relative to that same local clock, thus requiring the sampling clock to be generated with a predetermined amount of phase offset.

Typically, the steps associated with CDR include identification of suitable receive signal transitions, comparison of timing of said transitions with the local clock signal so as to produce a phase error signal, correction of the local clock signal using the phase error signal, and derivation of a properly timed sampling clock from the corrected local clock signal.

A CDR system may include a phase detector comparing the external timing reference with the local clock (e.g. the VCO output or a clock derived from the VCO output) to produce a phase error signal, a low-pass filter that smooths the phase error to produce a VCO control signal, and a voltage-controlled oscillator (VCO) producing a continuous clock oscillation at the controlled rate. In some embodiments, the VCO generates multiple clock phases to support multiple receive processing phases; in other embodiments the VCO operates at a multiple of the desired sampling rate, with digital clock dividers producing the desired lower speed clocks. In further embodiments, an adjustable phase interpolator is inserted into the phase-locked loop or one or more of its outputs, to introduce a phase offset that facilitates receive data sampling.

Decision Feedback Equalization

It has become common practice for data communications receivers to incorporate Decision Feedback Equalization (DFE) to compensate for signal propagation anomalies in the communications medium. The DFE system performs time-domain oriented equalization on the received signal by maintaining a history of previously-received data values at the receiver, and processing those historic data values with a transmission line model to predict the expected influence each of the historical data values would have on the present receive signal. Such a transmission line model may be pre-calculated, derived by measurement, or generated heuristically, and may encompass the effects of one or more than one previous data interval. The predicted influence of these one or more previous data intervals is collectively called the DFE compensation, which is subsequently applied to the received signal to facilitate the current unit interval's detection. For purposes of explanation, this computation may be simply described as comprising multiplication of each previous unit interval's data value by a predetermined scaling factor, and then summation of each of these scaled results representing the effects of successive previous unit intervals to produce a composite DFE compensation value representing the cumulative predicted effect of all such previous unit intervals.

In some receiver designs, this DFE compensation value will be subtracted from the current receive signal input, to produce a corrected signal more accurately representing the received data value. Such subtraction may be performed, as one example, by applying the received signal and the DFE compensation value to the inputs of a differential amplification circuit. In one common embodiment, this differential circuit represents the input of a digital comparator or a combined time- and amplitude-sampler, the output of which represents the detected data value relative to a particular speculative threshold level.

Those familiar with the art will recognize that the DFE compensation value produced as described above cannot be calculated until the previous unit interval's data value has been detected. Thus, as data rates increase, a point will be reached at which the information to produce the DFE compensation value is not available in time to be applied to the next unit interval sampling. Indeed, at the highest data rates currently used in practice, this situation may exist for multiple previous unit intervals, as the detection time for a single data value may represent multiple unit interval durations, requiring the receiver to pipeline or parallelize the detection operation. Thus, it is common for embodiments to forgo such "closed loop" DFE methods for one or more of the most recent unit intervals. Instead, such embodiments speculatively generate one or more elements of the DFE compensation value as "open loop" or "unrolled loop" operations. At least one embodiment extends this speculative DFE behavior by incorporating multiple data detection samplers; each sampler provided with a distinct speculative value of DFE compensation associated with the possible detected data value for one or more previous unit intervals. In such an embodiment, selection of one of the speculative DFE compensation values may be postponed until after the current unit interval data detection, by storing the results of the various comparator outputs (which are dependent on different speculative DFE compensation values) and then later selecting which stored output is to be used for data detection.

In the receiver embodiment illustrated in FIG. 1, one level of speculative DFE is generated, thus two data detection samplers (e.g. 131, 133) are provided within each processing slice 130 and 140, each adjusted to a different speculative DFE correction threshold, including a positive DFE correction threshold +vh1 used to generate data when the previous data decision was a '1', and a negative DFE correction threshold −vh1 used to generate data when the previous data decision was a '0'. The embodiment also incorporates two essentially parallel receive processing slices 130, 140, each processing the received signal 125 on alternating receive unit intervals using e.g., sampling clock phases ph000 and ph180. Multiplexors 150 and 160 are shown as combining the alternating receive signal and clock error results provided by the multiple receive phases 130 and 140 into full speed serial results; in other embodiments, these results may be retained as slower rate parallel streams for implementation convenience. DFE 170 and/or CDR 180 may incorporate digital storage elements such as registers or memory arrays to retain the historical data values and clock error results they require for their operation. Alternatively, a history buffer 190 may be configured to receive a sequence of data decisions (as well as error signals). In such an embodiment history buffer may provide the data decisions to DFE circuit 170 to apply correction factors for previous signaling intervals, and history buffer may additionally provide the data decisions of the CDR 180 for pattern detection in the phase detectors described below in the descriptions of FIGS. 3, 4, and 6.

The set of speculative DFE compensation values representing the constellation of potential detected data results over the previous transmit unit interval or intervals represent a set of measurement levels spanning some portion of the receive signal amplitude range. As an example, previous transmission of consecutive "zero" or "low" signals might lead to a predicted lower threshold level −vh1 for a subsequent receiver data measurement incorporating speculative DFE compensation, while previous transmission of consecutive "one" or "high" signals might lead to a predicted higher threshold level +vh1 for the same data measurement. Thus, for any data measurement used to detect an actual data value, the described multiple-sampler receiver will potentially perform measurement operations using thresholds either too high or too low for the actual signal during that interval. In some embodiments, these measurement operations from the samplers or comparators performing such speculative operations not directly associated with the actual data detection, although not used for determining the received data value, may nonetheless be used to obtain new information relating to clock recovery, thus mitigating the additional receiver power and complexity those devices add to the receiver.

Consider the processing of a receive signal in the present unit interval by processing slice 140. Under control of clock Ph180, samplers 141 and 142 capture the state of the received signal 125 relative to speculative DFE thresholds DFE3 and DFE4. When the correct data decision for the previous unit interval has been resolved by processing slice 130, the data decision may be provided to digital multiplexer 145 as a selection input to select one of the sampler results 142 or 144. Similarly, the selected data decision at the output of digital multiplexer 145 may be provided as a selection input to digital multiplexer 135.

CDR in a Speculative DFE System

Figure 2:
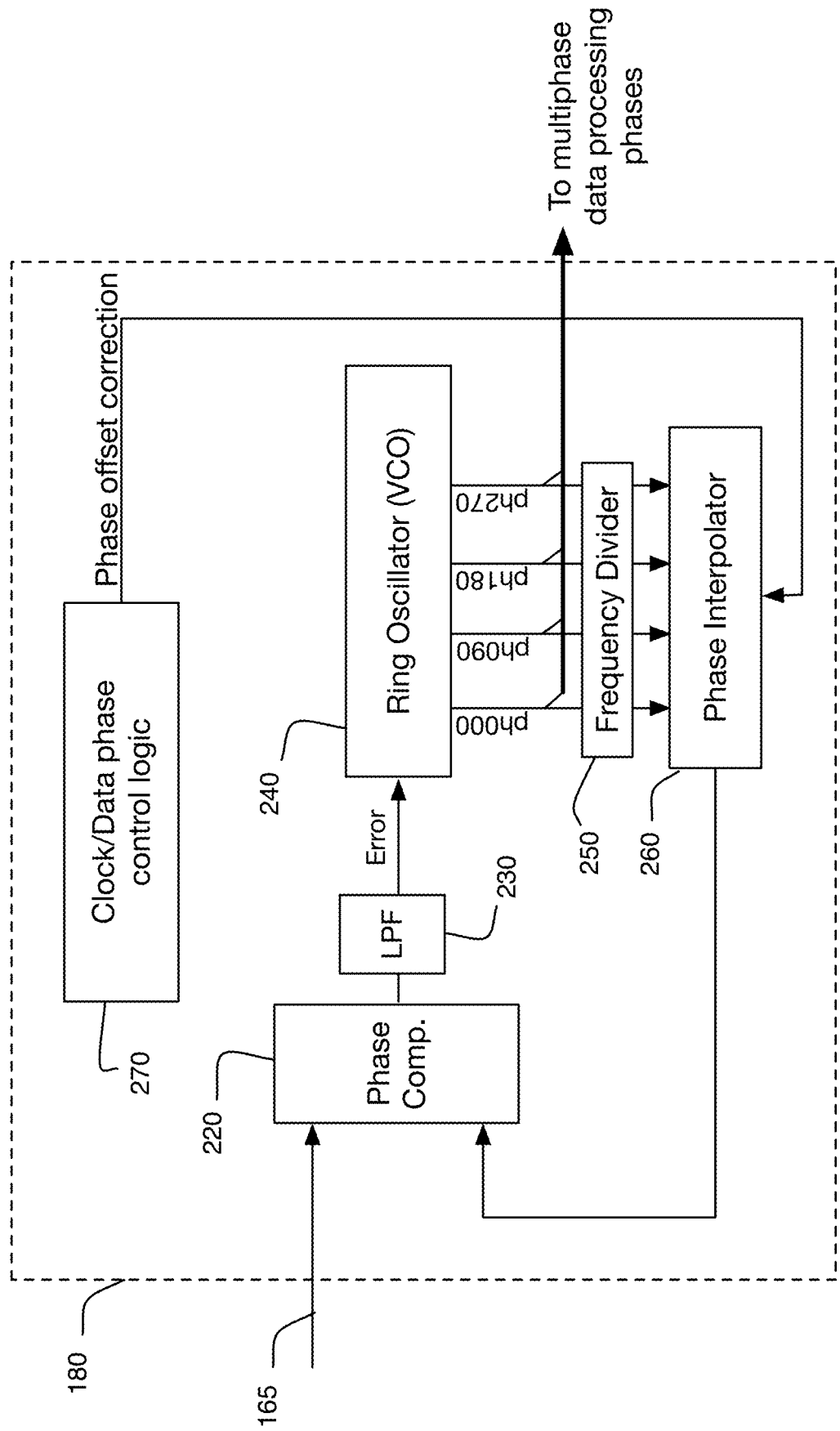
FIG. 2 is a block diagram of a CDR system, in accordance with some embodiments.

As taught by [Hormati], under some conditions the value captured by the other sampler in phase 140 may be used to determine a phase error for the sampler clock ph180 relative to a received signal transition occurring between the previous and current unit intervals. In this example the sampler results useful for CDR may be identified by the triplet data pattern of [last data, current data, next data] results, with the transitional data pattern [ 1, 0, 0] indicating timing information from the speculative "low" slicer utilizing a speculative DFE correction value of −vh1, and transitional data pattern [ 0, 1, 1] indicating timing information from the speculative "high" slicer utilizing a speculative DFE correction value of +vh1. As seen in FIG. 2, the sampled signal transition 165 may be phase compared 220 to a clock phase derived from VCO 240, producing an error signal which, if qualified by detection of a valid transitional data pattern, may be used by to correct the VCO phase and/or frequency, from which all sampling clocks are derived. In some embodiments transitional data patterns [1 0 0] and [0 1 1] are preferred due to jitter. Analyzing transitional data patterns [1 0 0] and [0 1 1] may ensure a smooth waveform and that the received signal has had enough time to settle. Therefore, the recovered clock has less jitter. Furthermore, DFE adaptation may be more robust as changing the speculative DFE correction values may linearly move the clock phase, and adaptation can be performed more precisely.

High Speed Error Computation

As described by [Hormati], the clock error computation is complex: waiting until previous data values have been resolved, pattern-matching received data sequences, performing the actual phase comparison, and then converting the result into an analog error signal. In many scenarios, such complexity moves the error computation out of the high-speed multiphase sampler domain and into the main receiver data path. In one particular example, the half-rate data streams obtained from two processing phases are aggregated into data words accepted by the main receiver data path at one-quarter received clock rate or slower. The redundant samples used for CDR computation are similarly latched for processing in the slower clock domain, but the introduction of these queuing and interleaving elements introduces inevitable delay into the closed loop of clock generation, resulting in lower than desirable loop bandwidth and poorer clock noise immunity.

[Tajalli] describes a gate embodiment suitable for linear interpolation between two clock phases, in which the four "arms" of a typical CMOS XOR gate are individually controlled, allowing the output to have separately controlled results in each quadrant of operation, and distinct analog output levels within each quadrant output. The present embodiment expands upon that design, by incorporating multiple sets of logic branches associated with a respective transitional data pattern (e.g., [1 0 0] or [0 1 1]) providing the data-sequence gating operation used for transition detection, where each set of logic branches further combines edge comparison phase detection via respective biasing elements for providing a charge-pump output action that produces an analog error output to control the VCO.

Figure 4:
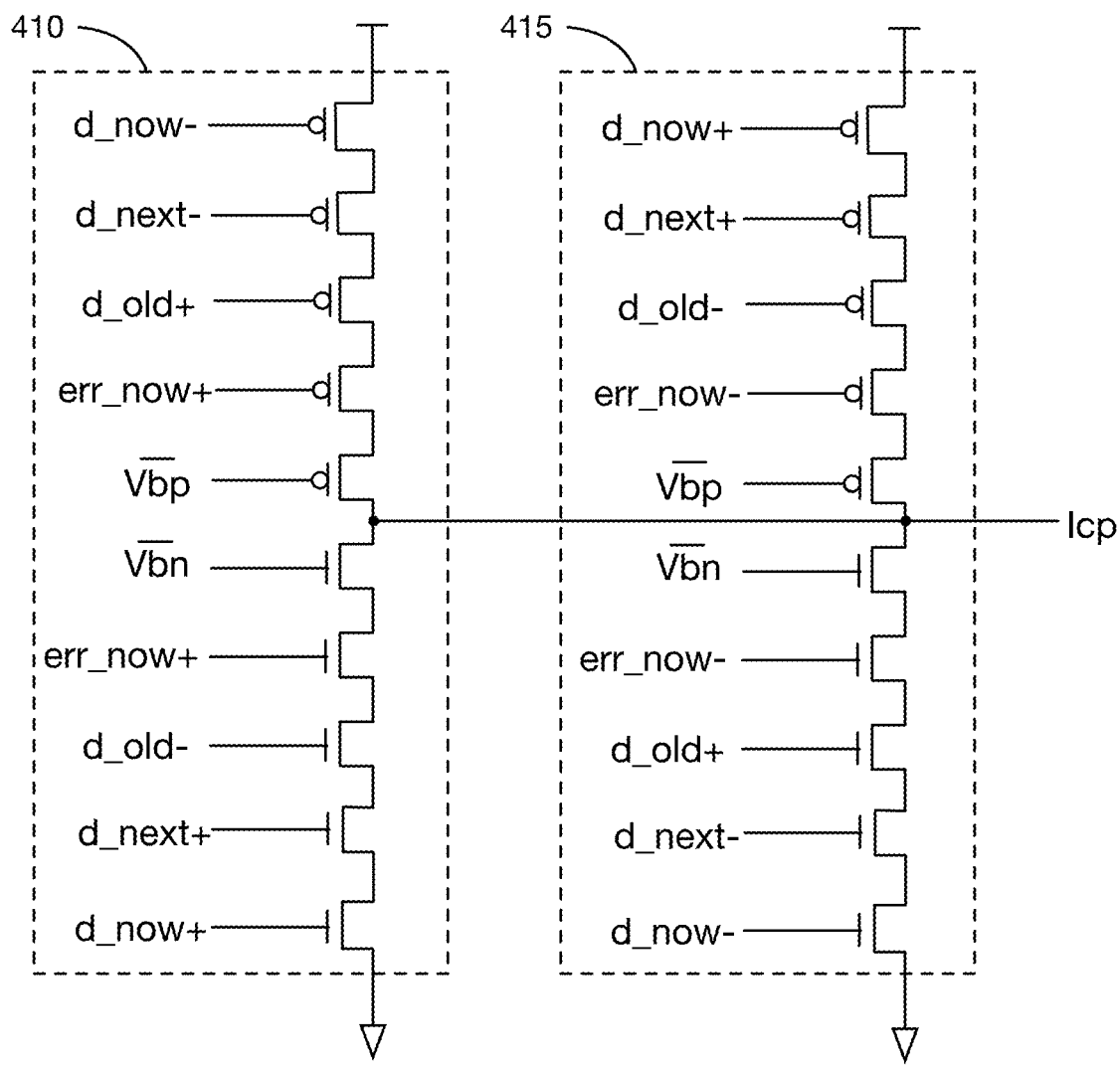
FIG. 4 is a circuit schematic of a combined logic network and charge pump circuit, in accordance with some embodiments.

As is well known to digital designers, implementing high fan-in CMOS logic gates by simple extension of the series- and parallel-connected transistor designs used for dual input gates can lead to slow response times and marginal output signal integrity. Strings of five series transistors are shown in FIG. 4 in each leg of the resulting gate, where three series transistors are used to detect a transitional data pattern, one series transistor is configured to receive the error signal, and one series transistor is biased, e.g., via Vbp or Vbn, to incorporate the combined charge pump functionality to directly produce an analog control signal.

Figure 3:
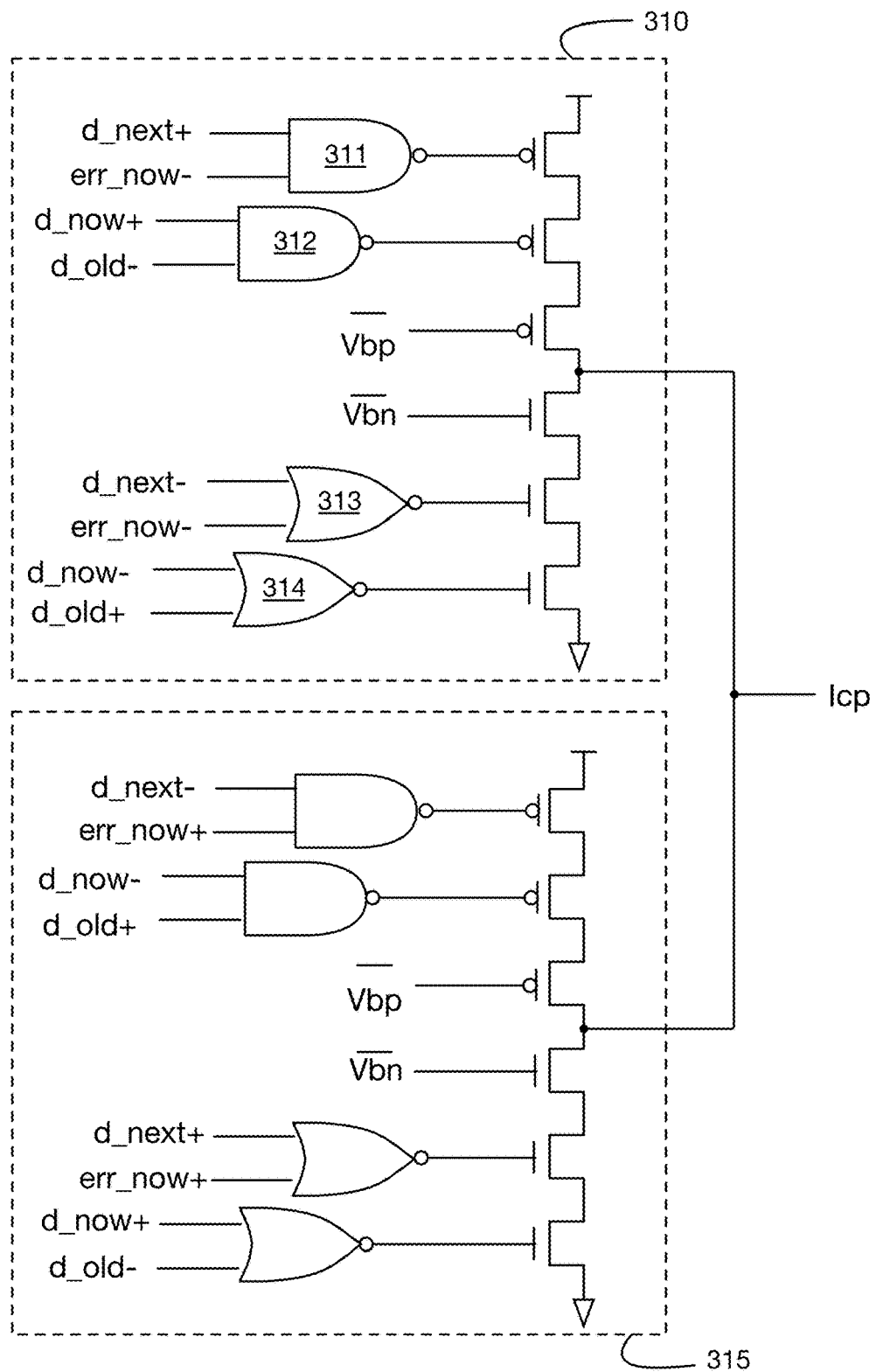
FIG. 3 is a circuit schematic of a combined logic network and chare pump circuit utilizing logic gates to provide control signals, in accordance with some embodiments.

The phase comparator embodiment of FIG. 3 does not attempt to combine all logic operations into a single series-connected transistor AND gate structure. Instead, simple two input logic gates are used to combine input signals to generate control signals driving the three series-connected transistors of the deconstructed XOR gate. The input signals are composed of the values of the current received data bit d_now, the previous received data bit d_old, the next received data bit d_next, and the current detected error bit err_now (i.e. the value sampled using the other speculative DFE value, concurrent with the sample that became d_now.) In the particular system embodiment of this example, all digital signals are available via the outputs of the multiplexers 135 and 145 in both true and compliment form, as one example d_now+ and d_now−, which are complimentary and have equivalent propagation delay. Thus, inverters may not be needed to provide the complimentary signals. Voltages $\overline{Vbp}$ and $\overline{Vbn}$ are bias voltages, which in some embodiments are configurable. The output current Icp may be applied directly to low pass filter 230 of FIG. 2 to produce a smoothed control signal Error for VCO 240. In the following description, the transitional data patterns may correspond to the outputs d_old+, d_now+ and d_next+ being [0 1 1] and [1 0 0], while complimentary inputs are selectively provided for detection of such transitional data patterns through the use of logic gates/branches. Such configurations are described in more detail below with respect to FIGS. 3 and 4.

As shown in FIG. 3, the combinatorial logic network includes two sets of logic branches, each set of logic branches associated with a respective transitional data pattern. Specifically, the set of logic branches 310 is configured to detect transitional data pattern [0 1 1] and the set of logic branches 315 is configured to detect transitional data pattern [1 0 0]. Each set of logic branch is further selectively configured to produce a pump up signal or a pump down signal based on a comparison of the error signal to the current data decision. In some embodiments, the pump up/pump down signal may be provided to a VCO utilizing inverted logic, thus a pump up signal may result in a decreased sampling clock frequency, while a pump down signal may result in an increased sampling clock frequency.

Figure 5A:
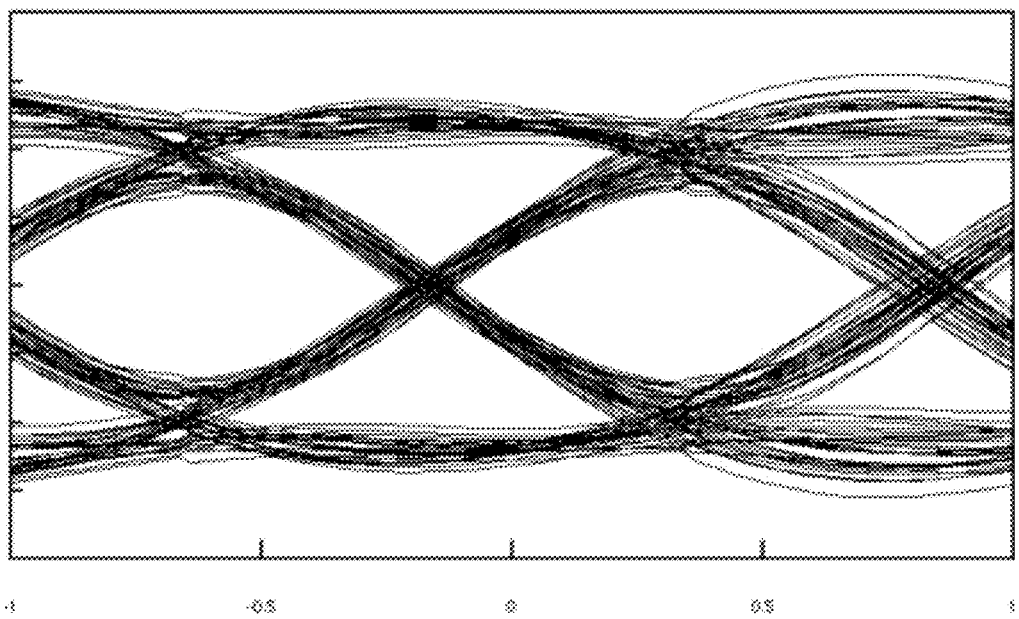
FIG. 5A is an eye diagram illustrating various signal transitions, in accordance with some embodiments.
Figure 5B:
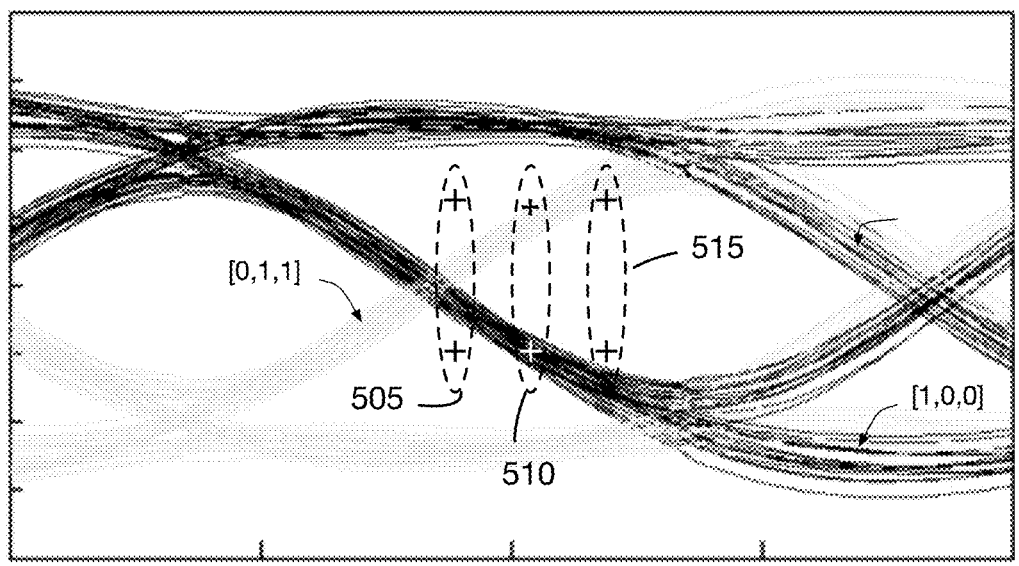
FIG. 5B is an eye diagram illustrating how speculative DFE samples may be analyzed according to an exemplary transitional data pattern, in accordance with some embodiments.

FIG. 5A is a waveform illustrating an eye diagram for various transitions, in accordance with some embodiments. FIG. 5B highlights transitions starting with a data_old '1' value. In particular, analyzing the transition marked [1 0 0], it may be observed that the relationship between the error signal (generated using the negative speculative DFE correction signal −vh1) and the data decision (generated using the positive speculative DFE correction signal +vh1) determines if the sampling clock is early or late. The pair of samples in 510 corresponds to a lock condition, as the error signal lies directly on the signal transition. However, if the sampling clock is early, e.g., 505, the data decision d_now+='1' and error signal error_now+='0' are different, and a control signal may be generated to decrease the frequency of the sampling clock. Similarly, if the sampling clock is late, e.g., 515, then then data decision d_now+='1' and error signal error_now+='1' are the same, and a control signal may be generated to increase the frequency of the sampling clock.

As shown in FIG. 3, the set of logic branches 310 includes a logic branch including PMOS transistors receiving control signals from NAND gates 311 and 312, as NAND gates only have one input combination providing a logic "low" output that will activate the active-low PMOS transistors. When the data decision d_old+ is '0' (thus d_old− is '1'), and d_now+ is '1', NAND 412 outputs logic '0', turning on the connected PMOS transistor. Similarly, when d_next+ is '1' and err_now+ is '0' (thus err_now− is '1'), NAND 311 outputs a logic '0', turning on the connected PMOS transistor. This particular configuration corresponds to the error signal err_now+ being different than the data decision d_now+, and such a scenario indicates that the sampling clock is early. Thus, the transistor biased by Vbp may be selectively enabled via NAND gates 311 and 312 to provide a charge pump up signal, which when provided to the VCO using inverted logic causes the frequency of the sampling clock to decrease.

Similarly, the set of logic branches 310 includes a logic branch including NMOS transistors receiving control signals from NOR gates 313 and 314, as NOR gates only have one input combination providing a logic "high" that will activate the active-high NMOS transistors. When the data decision d_old+ is '0', and d_now+ is '1' (thus d_now− is '0'), NOR 314 outputs logic '1', turning on the connected NMOS transistor. Similarly, when d_next+ is '1' (thus d_next− is '0') and err_now+ is '1' (thus err_now− is '0'), NOR 313 outputs a logic '1', turning on the connected NMOS transistor. This particular configuration corresponds to the error signal err_now+ being the same as the current data decision d_now+, and such a scenario indicates that the sampling clock is late. Thus, the transistor biased by Vbn may be selectively enabled via NOR gates 313 and 314 to provide a charge pump down signal, which when provided to the VCO using inverted logic causes the frequency of the sampling clock to increase. Similar observations may be made for the set of logic branches 315 configured to detect transitional data pattern [1 0 0].

In one system embodiment similar to that of FIG. 1, the optimized design of FIG. 3 permits CDR feedback to be generated directly from the data decisions and error signals of slices 130 and 140, greatly increasing the effective PLL loop bandwidth and reducing latency.

An alternative phase comparator embodiment shown in FIG. 4 uses a high-fan-in CMOS logic design to perform all logic operations in a single step including detection of a transitional data pattern based on the sequence of data decisions and selectively enabling a biasing element based on the error signal. Its functionality is equivalent to that of FIG. 3, although in some integrated circuit processes the propagation delay may be greater.

FIG. 4 includes sets of logic branches similar to those of FIG. 3, however the logic branches in FIG. 4 include series-connected transistors incorporating AND functions, each series-connected transistor having an inverted or non-inverted input depending on the transitional data pattern to be detected, and the relationship of the error signal with respect to the current data decision. As shown, the combinatorial logic network comprises sets of logic branches 410 and 415. The set of logic branches 410 includes logic branches for detecting transitional data pattern [data_old+, data_now+, data_new+]=[0 1 1]. The set of logic branches 415 includes logic branches for detecting transitional data pattern [data_old+, data_now+, data_new+]=[1 0 0].

Specifically, set of logic branches 410 includes a PMOS branch that receives the complimentary inputs d_now− and d_next minus, so that when the sequence of data decisions corresponds to [0 1 1] and the error_now+ is '0', the transistor biased by $\overline{Vbp}$ will be configured to produce a pump up signal, which will decrease the frequency of the sampling clock as previously described, as the sampling clock is early. Set of logic branches 410 further includes a PMOS branch configured to detect the same transitional data pattern, this time inverting the previous data decision d_old. However, when error_now+ is '1' the NMOS branch selectively enables the transistor biased by $\overline{Vbn}$ to generate a pump down signal, which will increase the frequency of the sampling clock generated by the VCO as described above.

Similar observations may be made for the set of logic branches 415 that are configured to detect transitional data pattern [1 0 0], and to output a pump up or pump down signal in response to a comparison of the error signal to the current data decision.

The number of received data samples considered as part of the computation of DFE corrections will vary from embodiment to embodiment, depending on the communications channel characteristics. Different embodiments may also rely on pattern matching against different numbers of received data values in qualifying a clock error value, or indeed in determining which of several speculative data samples is correct. Thus, no limitation should be inferred from the specific size of the patterns used in the examples, or use of one stage of speculation. Similarly, embodiments incorporating differently configured signal filtration (i.e. producing as a result different delay relationships for different signal trajectories and sampling point locations) may utilize different historical data value sequences when selecting such desirable sampler results. The naming of e.g. data value triplets as [last data, current data, next data] is arbitrary and chosen for descriptive simplicity, with no limitation implied; in an embodiment which maintains a historical record of received data values as described herein, such a sequence may be equally well comprised of any set of sequential historical values, such as [historically penultimate data value, historically last data value, current data value], etc. Indeed, in at least one embodiment the sequence of data values used in sampler selection, the stored sampler value selected for data detection, and the stored sampler value selected as relevant to updating of the CDR phase, all represent receive unit intervals previous to the present time.

In some system embodiments, received data signals and/or potential clock error values are captured in a history buffer 190 that may be made up of e.g., digital latches associated with each receive phase instance to provide the necessary history of values. In other embodiments, such storage is centralized, as examples in a data buffer, memory, or shift register. In some embodiments, said centralized storage may be associated and/or co-located with the DFE correction computation. In some embodiments, the history buffer includes separate buffer elements for independently maintaining data decisions and error signals.

Multi-Mode Operation

Figure 6:
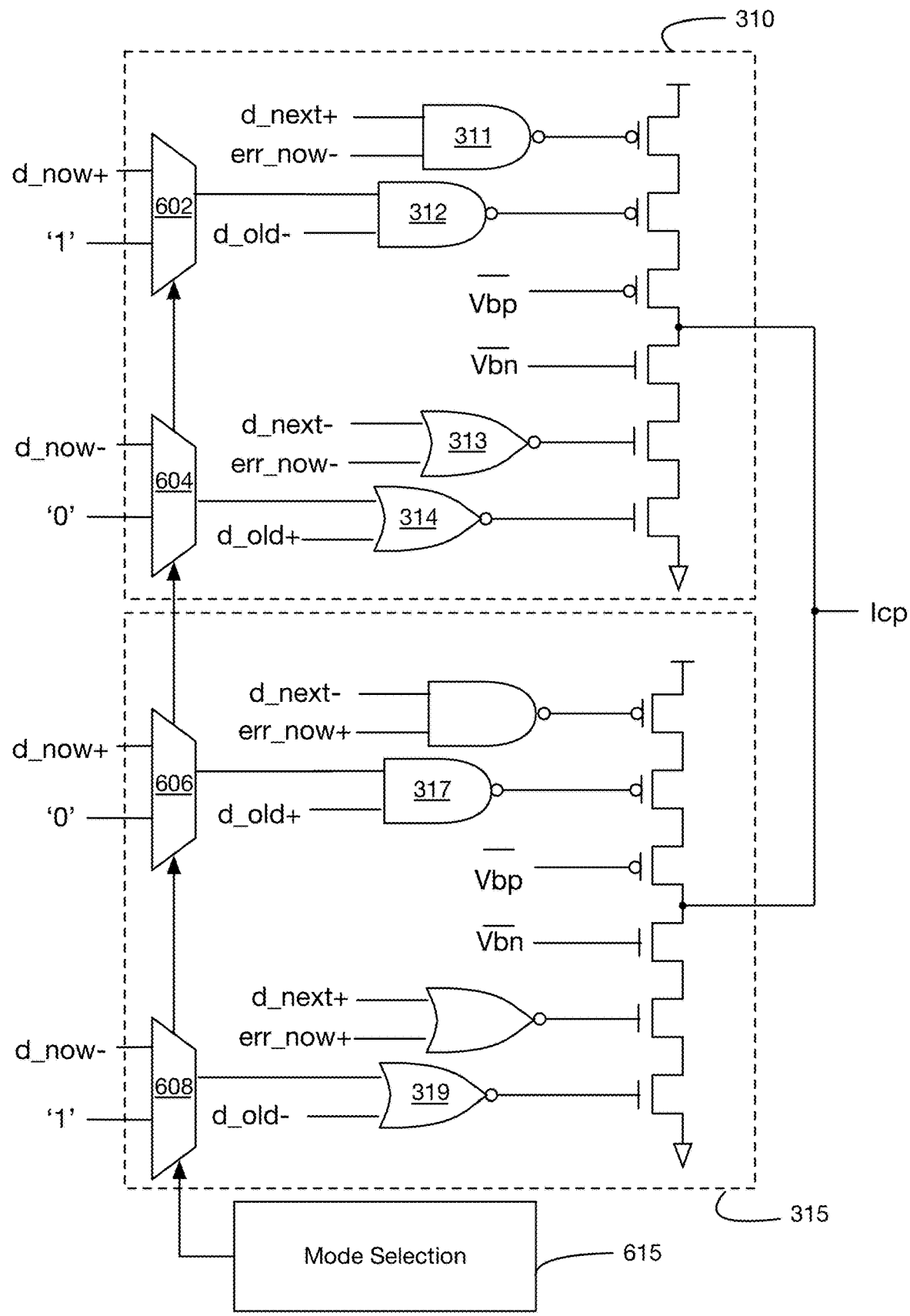
FIG. 6 is a multi-mode system configurable of providing local oscillator control signals in a baud-rate or double-rate mode of operation.
Figure 7:
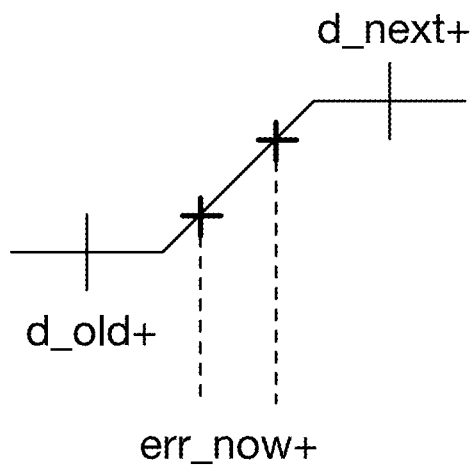
FIG. 7 illustrates wave forms for transitional data patterns in a double-rate system.
Figure 7:
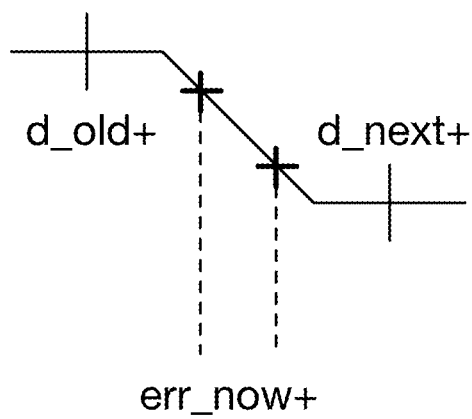

While the above description focuses primarily on utilizing speculative DFE correction samples as error signals, it should be noted that other means of generating data and edge samples may be used as well. For example, at least one embodiment may generate the sequence of data decisions and the error signal in a double sampling mode, in which case one processing slice operating on e.g., phase 000 of the sampling clock may be generating data decisions, while another processing slice operating on e.g., phase 180 of the sampling clock may be generating edge samples. In such a double-rate schemed, the inputs of the combinatorial logic may be selectively modified. In particular, looking at FIG. 6, the input to gate 312 may be selectively tied to '1' and the input to gate 314 may be selectively tied to '0' for the set of logic branches 310, e.g., via multiplexers 602 and 604, respectively, the multiplexers receiving a control signal from mode selection circuit 615. Similarly, in the set of logic branches 315, the input to gate 317 may be selectively tied to '0' and the input to gate 319 may be selectively tied to '1' via multiplexer 606 and 608, respectively. In this scenario, the set of logic branches 310 are configured to detect transitional data pattern [d_old+=0, d_next+=1] and the set of logic branches are detecting transitional data pattern [1 0]. The err_now+ signal is an edge sample that is compared to the d_next+ signal in order to generate a control signal for increasing or decreasing the frequency of the sampling clock. A waveform for the [0 1] and [1 0] transitional data patterns is given in FIG. 7. As shown in FIG. 7, for a transitional data pattern of [0 1] an err_now+ being equal to d_old+='0' indicates that the sampling clock is early, while an error_now+ being equal to d_next+='1' indicates that the sampling clock is late. Similarly, for a transitional data pattern of [1 0], an err_now+ being equal to d_old+='1' indicates that the sampling clock is early, while an error_now+ being equal to d_next+='0' indicates that the sampling clock is late. Some embodiments may utilize a mode selection circuit 615 as shown in FIG. 6 configured to selectively control multiplexers tied to inputs of logic gates 312, 314, 317, and 319 to tie the inputs to the levels shown in FIG. 6 when operating in a double-rate system, or to selectively configure the switches to tie the inputs of the gates associated with d_now+ and d_now− to inputs d_now+ and d_now− in the baud rate system.

Loop Filter Considerations

Figure 8:
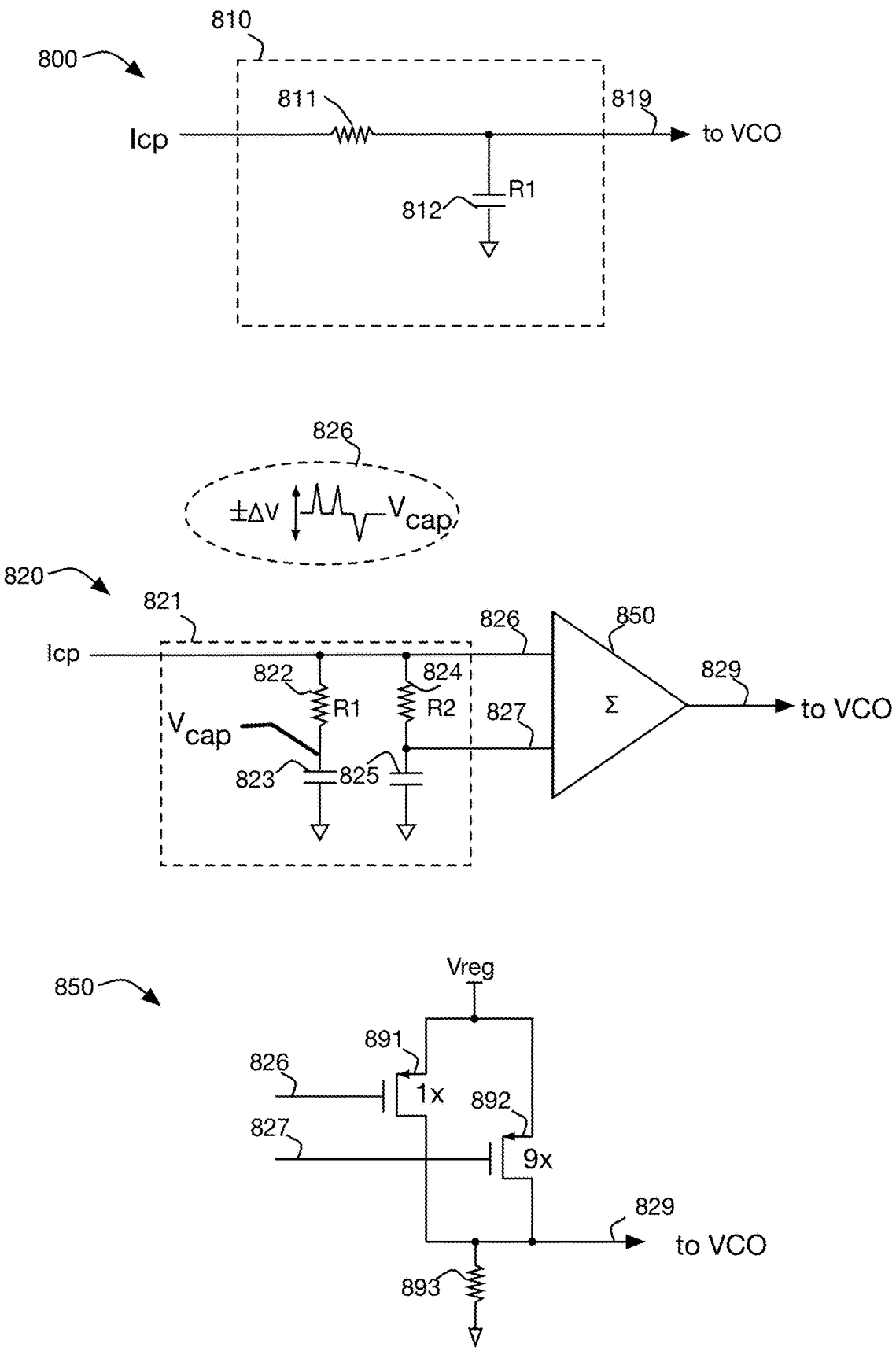
FIG. 8 illustrates embodiments of analog phase lock loop filters.

As is well known in the art, the number and location of transfer function poles and zeroes in the phase lock loop filter strongly impact the resulting loop stability and responsiveness. Some PLL embodiments as in FIG. 2 incorporate a low-pass filter as 810 of FIG. 8, processing the incremental pump-up/pump-down pulses of Icp (as described above) into the smooth control signal for to adjusting the VCO frequency. In further embodiments, a two or more pole filter may allow greater loop gain without loss of stability, leading to greater loop control bandwidth. As shown, the local oscillator controller 810 is configured to receive the output current Icp from the combined PD/PI/CPC and to adjust an input voltage 819 of a proportional control circuit, the output current sourcing and sinking current to capacitor 812 through a resistive element 811 to adjust the input voltage 819 on the capacitor 812.

In some embodiments, it may be desirable for one of the filter time constants to be significantly longer than the other, as one example to provide a longer interval of "free wheeling" clock output at a stable frequency during gaps between clock error samples. In such cases, it may be desirable to have greater control than provided by circuit 800 over the relative amounts by which the short-time-constant and long-time-constant results impact the overall VCO control signal. The embodiment 820 modifies the previous analog filter by adjusting a first voltage 826 at an input of a proportional control circuit, using a filter having a first time constant associated with the filter made up of resistor/capacitor network including R1 822 and capacitor 823, and a adjusting a second voltage 827 at an input of an integral control circuit using a filter having a second time constant from resistor/capacitor network including R2 824 and capacitor 825. In some embodiments, R1<<R2, and the RC time constant associated with R2 is much larger than that of R1. As R1<<R2, the output current Icp of the charge pump will primarily flow through R1. The voltage on capacitor 823 reaches equilibrium based on the output current Icp, and pulses in the output current Icp generated responsive to early or late votes generate voltage pulses ΔV across R1 relative to the voltage $V_{cap}$ on capacitor 823, as illustrated by the waveform of the voltage 826. The value of ΔV may be determined by numerous factors including the magnitude of output current Icp and resistor R1. The voltage pulses adjust an input voltage at the proportional control circuit generating the proportional control signal (described below with respect to proportional control circuit 891). As the voltage $V_{cap}$ on capacitor 823 changes, a portion of the output current Icp may flow through R2, changing the voltage on capacitor 825. The voltage on capacitor 825 may change relatively slowly due to the higher RC time constant. As shown, the voltage on capacitor 825 is provided as an input voltage 827 to integral control circuit 892, while the voltage 826 is provided as an input voltage to proportional control circuit 891. The proportional and integral control signals may then be summed in summation circuit 850, e.g., by an analog current summation to produce an overall local oscillator control signal 829. In some embodiments, summation element 850 separately weights the proportional control signal 826 and integral control signal 827 to produce local oscillator control signal 829; as one example, input 827 may have nine times the effect on the result compared to input 826. In such embodiments, the integral control signal may have a higher relative weight applied to it to make large, slow (due to the integration of the early-late votes over time) changes to the frequency of the VCO to maintain a frequency lock of the VCO, while the proportional control signal may make relatively smaller magnitude frequency changes to the VCO to correct phase offsets between the VCO and the received data. Furthermore, the overall gain KVCO of the local oscillator control signal may be controlled by the individual gains KVCO1 and KVCO2 of the proportional control signal and the integral control signal, respectively. In one embodiment of 850 further detailed in FIG. 8, inputs 826 and 827 control PMOS transistors 891 and 892, respectively, powered by a regulated supply voltage Vreg, producing currents that are summed into load resistor 893 to obtain local oscillator control signal 829. The 1× to 9× relationship of transistor 891 to 892 is one particular embodiment and should not be considered limiting. The 1× and 9× input weights may be obtained e.g., by scaling the size of the PMOS transistors; continuing the previous example, the transistor corresponding to integral control circuit 892 associated with input voltage 827 being nine times larger (or alternatively, comprised of nine instances of unity-sized transistors,) relative to the unity-sized transistor corresponding to proportional control circuit 891 associated with input voltage 826. Equivalent summation circuits are well known in the art and may be interchangeable with this example embodiment.

For more significant time constant differences, an analog integrated circuit embodiment of the longer time constant may become intractable. In such cases, a digital loop filter may be utilized to produce some or all of the necessary loop control signal. Rather than voltage on a capacitor, the storage element in a digital filter is a numeric value stored in a register, with an analog output result obtained using a digital-to-analog converter (DAC) controlled by that numeric value. Incremental "pump-up" and "pump-down" inputs to the digital filter may cause the storage register value to be incremented or decremented by a fixed or configured amount. Such a method should not be considered limiting, as any other known equivalent digital filter method may be used.

Figure 9:
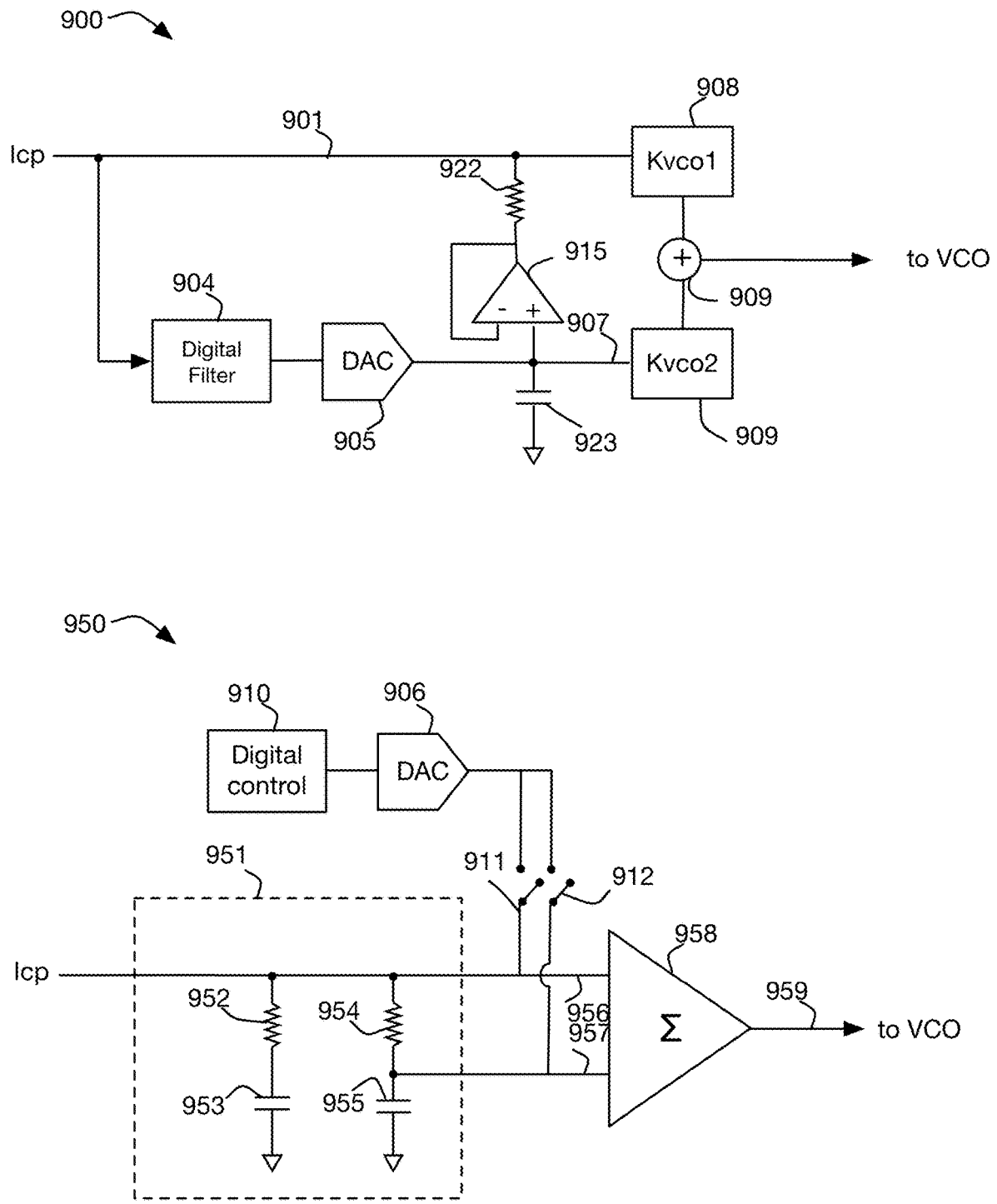
FIG. 9 illustrates embodiments of phase lock loop filters combining analog and digital elements.

One known limitation of fully digital loop filters is that their discrete-time-sampling nature introduces an inherent latency, which may present itself in the PLL as undesirable clock jitter. FIG. 9 illustrates a hybrid loop filter, in which the inherent low latency of the embodiments of FIG. 3 or FIG. 6 adjust the input voltage of the proportional control circuit via the analog loop filter composed of resistor 922 and 923, with the input voltage to the integral control circuit either provided exclusively by a digital loop filter or as a combination of an analog filter and a digital filter.

In embodiment 900, output current Icp is configured to adjust an input voltage 901 of a proportional control circuit 908 by sourcing and sinking current through resistive element 922. Furthermore, the output current Icp may be provided as an input to digital filter 904, which in response adjusts, as examples increments or decrements, a value in a digital counter, register, or memory, producing a digital result controlling DAC 905 that sets the voltage 907 on capacitor 923. Amplifier 915 may act as a buffer element preventing current flow to cap 923, which has a voltage 907 set by DAC 905. In FIG. 9, the voltage on capacitor 923 may be provided directly as an input voltage to an integral control circuit 908. As previously described relative to 850 of FIG. 8, proportional control circuit 908 and integral control circuit 909 may apply respective weights, the outputs of which are combined 920 to produce the local oscillator control signal. In some embodiments, amplifier 915 may be omitted and resistor 922 may be directly connected to capacitor 923.

Although the simplified example of FIG. 9 shows Icp as a control input to Digital Filter 904, an alternative embodiment in which the digital error signals input into FIG. 3 or 6 are accepted directly by the digital filter logic will produce equivalent results.

In a further embodiment, a Digital Filter 906 may additionally incorporate start-up or initialization logic that presets its output to a predefined or configured value or adjusts its output to obtain a desired PLL output frequency before normal operation begins, to minimize loop start-up time or reduce the likelihood of false or spurious pseudo-loop-lock at an incorrect initial frequency.

In such an embodiment 950, the circuit of 820 is augmented by inclusion of digital control 910 driving DAC 906 and producing an output to set the voltages 956 and 957 connected to the proportional and integral control circuits, respectively, via switches 911 and 912. In some embodiments, the voltages on 956 and 957 may be set equally, while alternative embodiments may set voltages 956 and 957 independently. In one operational scenario, the digital control enables the DAC output during start-up or initialization, as one example to ensure that the PLL starts at or near (e.g., within 1%) of the correct frequency. In another operational scenario, the DAC continues to provide a small contribution to the combined phase error value during normal operation, representing a relatively long time constant result as in 900, or an offset or bias signal.

Figure 10:
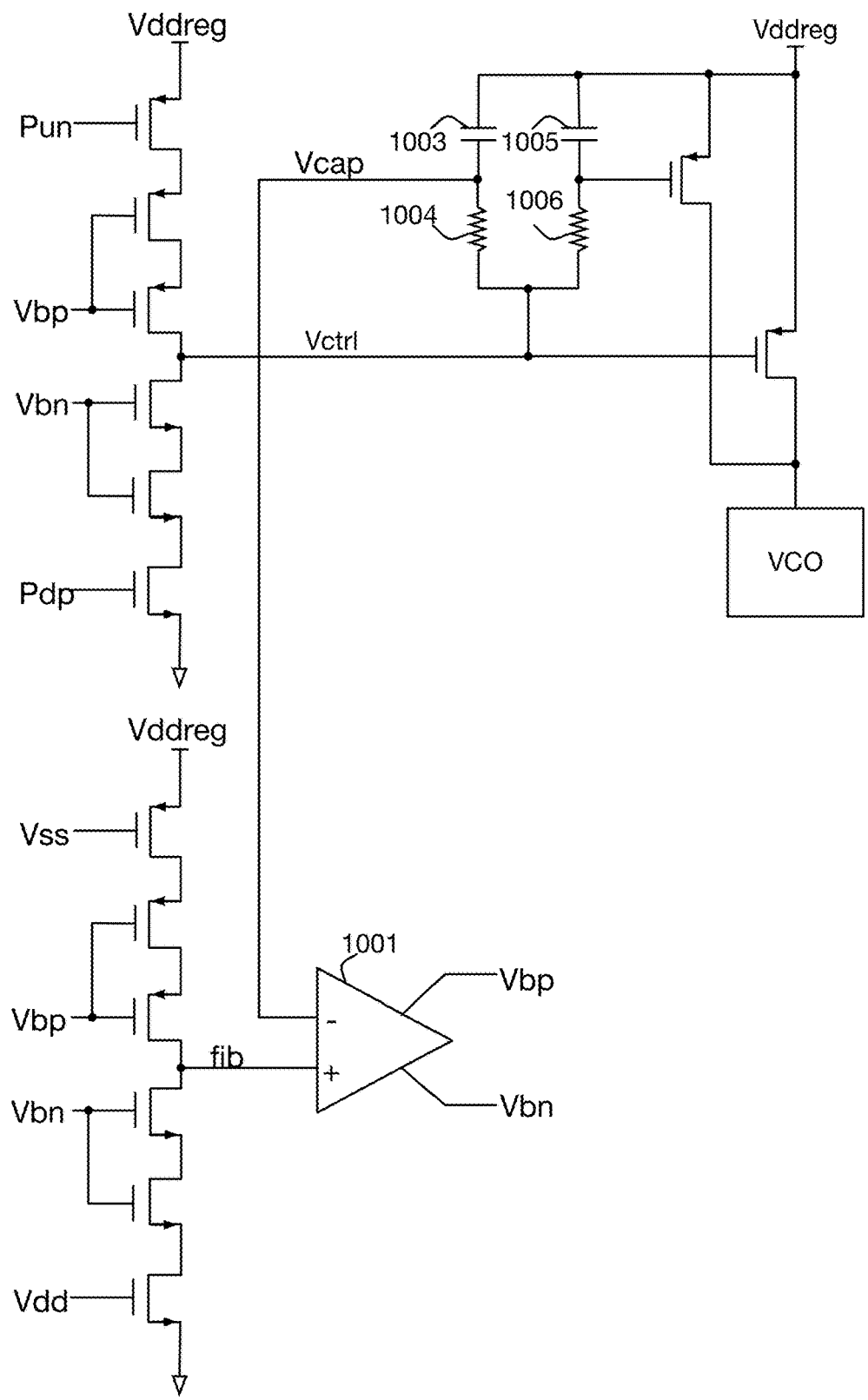
FIG. 10 illustrates a charge pump biasing circuit used in one embodiment.

FIG. 10 illustrates a bias circuit used in one embodiment to ensure that pump-up and pump-down currents are balanced in the phase detector charge pump output to the low pass filter. In the active charge pump, digital pulses Pun and Pdp control pump-up and pump-down actions to output Vctl. Concurrently differential input/differential output amplifier 1001 uses a replica filter element 1003/1004 and a replica charge pump output fib to produce outputs Vbp and Vbn that control the currents produced during the respective pump up and pump down actions, as previously described in FIGS. 3, 4, and 6. As both pump up and pump down legs are enabled continuously in the replica charge pump, differential output voltages Vbp and Vbn will be adjusted by comparator 1001 such that replica filter result Vcap matches replica charge pump output fib, simultaneously balancing the active charge pump results Vctl.

I claim:

1. A method comprising:
    obtaining a sequence of data decisions from a history buffer and an error signal, the sequence of data decisions and the error signal generated by one or more samplers operating on a received input signal according to a sampling clock;
    applying the sequence of data decisions and the error signal to each logic branch of a set of logic branches, and responsively selecting a logic branch from the set of logic branches, the logic branch selected responsive to (i) a detection of a transitional data pattern in the sequence of data decisions and (ii) the error signal, the selected logic branch generating an output current; and
    providing the output current to a local oscillator controller to adjust an input voltage of a proportional control circuit, the output current sourcing and sinking current to a capacitor through a resistive element to adjust the input voltage of the proportional control circuit relative to a voltage on the capacitor connected to the resistive element.

2. The method of claim 1, further comprising adjusting an input voltage of an integral control circuit.

3. The method of claim 2, wherein adjusting the input voltage of the integral control circuit comprises sourcing and sinking a portion of the output current to a second capacitor via a second resistive element.

4. The method of claim 3, wherein the input voltage of the integral control circuit is adjusted responsive to a change in the voltage on the capacitor connected to the resistive element.

5. The method of claim 2, wherein adjusting the input voltage of the integral control circuit comprises generating an analog voltage using a digital-to-analog converter (DAC).

6. The method of claim 5, wherein the analog voltage is generated from accumulating error signals in a multi-bit register.

7. The method of claim 1, wherein the sequence of data decisions and the error signal are applied to each logic branch via respective sets of series-connected transistors in the logic branch.

8. The method of claim 1, wherein the sequence of data decisions and error signal are obtained from samplers applying speculative DFE correction values to the received input signal.

9. The method of claim 1, wherein the received input signal corresponds to an output of a multi-input comparator.

10. The method of claim 1, wherein the received input signal corresponds to one data phase of a plurality of data phases.

11. An apparatus comprising:
    one or more samplers configured to operate on a received input signal according to a sampling clock, the one or more samplers further configured to generate a sequence of data decisions obtained from a history buffer and an error signal;
    a set of logic branches, each logic branch receiving the sequence of data decisions and the error signal, each logic branch from the set of logic branches configured to be selected in accordance with the sequence of data decisions and the error signal responsive to (i) a detection of a transitional data pattern in the sequence of data decisions and (ii) the error signal, the selected logic branch configured to generate an output current; and
    a local oscillator controller configured to receive the output current and to adjust an input voltage of a proportional control circuit, the output current sourcing and sinking current to a capacitor through a resistive element to adjust the input voltage of the proportional control circuit relative to a voltage on the capacitor connected to the resistive element.

12. The apparatus of claim 11, further comprising an integral control circuit, and wherein the local oscillator controller is configured to adjust an input voltage to the integral control circuit.

13. The apparatus of claim 12, wherein the local oscillator controller is configured to adjust the input voltage of the integral control circuit by sourcing and sinking a portion of the output current to a second capacitor via a second resistive element.

14. The apparatus of claim 13, wherein the input voltage of the integral control circuit is adjusted responsive to a change in the voltage on the capacitor connected to the resistive element.

15. The apparatus of claim 12, wherein the local oscillator controller comprises a digital-to-analog converter (DAC) configured to adjust the input voltage of the integral control circuit.

16. The apparatus of claim 15, wherein the DAC comprises a multi-bit register configured to accumulate error signals to adjust the input voltage of the integral control circuit.

17. The apparatus of claim 11, wherein each logic branch comprises a respective set of series-connected transistors configured to receive the sequence of data decisions and the error signal.

18. The apparatus of claim 11, wherein the one or more sampler are configured to apply speculative DFE correction values to the received input signal.

19. The apparatus of claim 11, further comprising a multi-input comparator configured to generate the received input signal.

20. The apparatus of claim 11, wherein the received input signal corresponds to one data phase of a plurality of data phases.

* * * * *